United States Patent [19]

Hall, II et al.

[11] Patent Number: 4,732,281

[45] Date of Patent: Mar. 22, 1988

[54] MOUNTING BRACKET ASSEMBLY FOR ELECTRONIC INSTRUMENT MOUNTING, HEAT DISSIPATION AND ENVIRONMENTAL PROTECTION

[75] Inventors: George R. Hall, II, Wickliffe; Lonnie J. Richman, Eastlake, both of Ohio

[73] Assignee: The Babcock & Wilcox Company, New Orleans, La.

[21] Appl. No.: 846,391

[22] Filed: Mar. 31, 1986

[51] Int. Cl.$^4$ ............................................. A47F 7/00
[52] U.S. Cl. ..................................... 211/26; 248/27.1; 403/261
[58] Field of Search ............ 211/26; 248/27.1, 316.1; 403/259, 260, 261, 193, 157

[56] References Cited

U.S. PATENT DOCUMENTS

| | | | |
|---|---|---|---|
| 2,437,111 | 3/1948 | McKeige | 403/193 X |
| 2,549,192 | 4/1951 | Gresham | 248/27.1 X |
| 2,562,260 | 7/1951 | Caldwell | 248/27.1 |
| 2,665,094 | 1/1954 | Christophersen | 248/27.1 |
| 2,741,448 | 4/1956 | Beckwith | 248/27.1 |
| 3,090,587 | 5/1963 | Peterson | 248/27.1 |
| 3,829,599 | 8/1974 | Fujioka | 248/27.1 X |
| 4,018,537 | 4/1977 | Koch et al. | 403/259 X |
| 4,494,720 | 1/1985 | Gregory et al. | 248/1 F |

Primary Examiner—Ramon S. Britts
Assistant Examiner—Blair Johnson
Attorney, Agent, or Firm—Robert J. Edwards; Vytas R. Matas; Eric Marich

[57] ABSTRACT

A mounting bracket assembly for electronic instrument mounting which also provides for heat dissipation and environmental protection. Side slots in the sides of the mounting bracket permit natural convection air currents to circulate through a plurality of openings in the top and bottom sides of the housing module secured by the assembly to a control panel, but prevent direct entry of liquids, particle contaminents or projections from coming into contact with the electronics contained therein.

3 Claims, 11 Drawing Figures

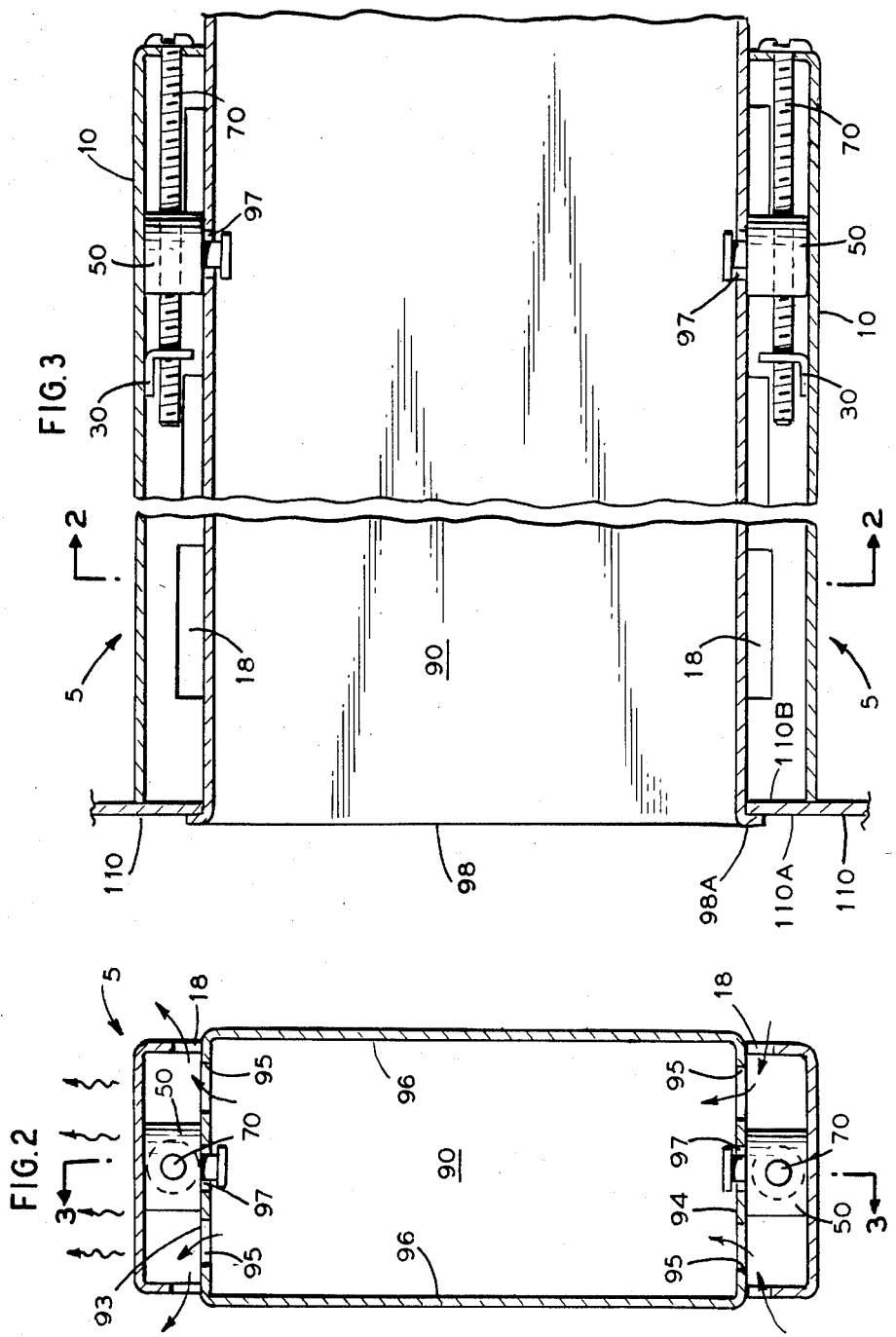

MOUNTING BRACKET ASSEMBLY FOR ELECTRONIC INSTRUMENT MOUNTING, HEAT DISSIPATION AND ENVIRONMENTAL PROTECTION

BACKGROUND OF THE INVENTION (1) Field of the Invention

The present invention relates in general to apparatus for the mounting of electronic instruments or components, and in particular to a new and novel mounting bracket assembly for housing modules containing electronic instruments or components that also provides for heat dissipation and environmental protection.

(2) Description of the Related Art

While advances in electronics have reduced the size and power consumption requirements of many devices used in industry, the need to locate, arrange and mount any given system comprised of these devices has continued. Simplicity of arrangement, ease of initial installation and subsequent removal for service or replacement, efficiency in design (both economic and mechanical) and above all, safety, predominate the concerns facing the designer of a particular system's actual field installation. With the modularization of many electronic components, field installation concerns often center upon locating the various housing modules that contain the electronic devices in openings in a control panel or instrument console. The electronic modules themselves are then electrically interconnected behind the face of the control panel to complete the system. The housing modules themselves are usually made of steel or aluminum sheet metal. To facilitate the utilization of a standardized design, various engineering standards have settled upon certain size housing modules, clearances and panel openings. Such a system of standardized components aids in the interchangeability of hardware and minimizes the total number of configurations required.

Given that the housing modules contain electronic instruments or components (hereinafter referred to as electronics), a major concern in any field installation is to ensure that there is sufficient heat dissipation to prevent damage or destruction of the electronics. The source of this heat is the electronics themselves. This is still a concern notwithstanding the above-mentioned advances in miniaturization and reduction of power consumption requirements, since the miniaturization process itself has led to circuitry and structures of a much denser configuration than previously encountered. Not all electronics generate the same amount of heat during operation. Accordingly, the means employed to handle the problem of heat dissipation will vary depending upon the heat load present. At relatively low levels of heat load, heat dissipation can be handled satisfactorily through radiation and natural convection from the solid walls of the housing modules that contain the electronics. At steady state conditions, the heat generated by the electronics will equal the heat being rejected to the surroundings. This will result in the establishment of certain steady state temperatures for the electronics and the housing modules themselves, which are a function of the materials employed and the ability of the housing module to dissipate heat. If the electronics steady state operating temperature is greater than their design limit, other measures will be necessary. The above-described heat transfer process is "passive" in nature; i.e., other than the structure of the housing module itself, no additional measures are provided to improve the heat dissipation. Of course there are some levels of heat generation that can only be handled by forced cooling with air or other media; these types of aided heat dissipation would be characterized as an "active" design. While the present invention can be used in a forced cooling environment (using air or other gaseous media) the design of such equipment to provide the forced cooling is beyond the scope of the present invention.

Another well-known passive technique to increase the heat dissipation capability of the housing modules is to provide a plurality of openings in the top and bottom sides of the housing modules, thereby allowing natural convection air currents to pass through the housing module (as well as around and along the sides of the housing module) to aid in heat dissipation. While the increased heat dissipation ability of the multiple openings in the top and bottom sides of the housing module is quite evident, certain disadvantages became apparent with such a design. Firstly, by being open on the top, the internal electronics were now exposed to dripping conductive and/or corrosive liquids, or to particles of dirt, debris or other contaminents, that could fall through the openings and damage the electronics contained therein. Secondly, and of equal importance, the potential for electrical shock to an individual working in the vicinity of the housing modules, due to a tool or other conductive projection falling through one of the openings in the housing modules and contacting the electronics within, was increased. In addition, with either of the above two housing module designs, numerous types of mounting apparatus had been used to secure the housing module to the control panel, undoing to an extent the standardization efforts urged by the above mentioned engineering standards. It has thus become desirable to develop a mounting bracket apparatus for housing modules containing electronics that will facilitate the dissipation of heat generated by the electronics while at the same time eliminating the prior art problems of contamination and potential for electrical shock.

SUMMARY OF THE INVENTION

The present invention provides a new and novel mounting bracket assembly that also provides for heat dissipation and environmental protection. By shielding the plurality of openings in the top and/or bottom sides of a housing module, dirt, debris, or liquid contaminents face a tortuous path of entry before they can reach the electronics contained therein. The side slots in the mounting bracket assembly, however, still allow the free flow of natural convection air currents through the housing module that will cool the contained electronics. Further, since the mounting bracket assembly is in direct contact with the natural convection air currents, it will be heated as well, and will thus provide additional surface area to aid in heat dissipation by radiation and/or convection. Finally, an increased degree of protection from hazardous shock is also provided by the mounting bracket assembly, since a tool or other projection would have extreme difficulty in passing through the side slots of the mounting bracket assembly, and thence into the openings in the housing module itself. Alternative embodiments could incorporate extended surface fins placed upon the top of the mounting bracket assembly, which would enhance the radiant and/or convective heat dissipative qualities of the present invention. Such a design might, therefore, favor manufacture of the present invention via an extrusion process, since the fins could then be created in one step with little difficulty.

Accordingly, an aspect of the present invention is to provide a mounting bracket assembly for securing a housing module containing electronics to a control panel that is easily attached to or removed from the control panel in a given installation.

Another aspect of the present invention is to provide a mounting bracket assembly for securing a housing module containing electronics to a control panel that is self-aligning, both with respect to the housing module it secures and to the control panel to which the housing module is attached, and is also self-compressing against the housing module itself.

Still another aspect of the present invention is to provide a mounting bracket assembly for securing a housing module containing electronics to a control panel that also provides for heat dissipation.

Yet still another aspect of the present invention is to provide a mounting bracket assembly for securing a housing module containing electronics to a control panel that also provides for environmental protection.

The various features of novelty which characterize the invention are pointed out with particularity in the claims annexed to and forming a part of this disclosure. For a better understanding of the present invention, its operating advantages and specific objects attained by its uses, reference is made to the accompanying drawings and descriptive matter in which a preferred embodiment of the present invention is illustrated.

BRIEF DESCRIPTION OF THE DRAWINGS

FIG. 2 is an end view of FIG. 1.

FIG. 3 is a side view of FIG. 1.

DESCRIPTION OF THE PREFERRED EMBODIMENTS

Figure 1:
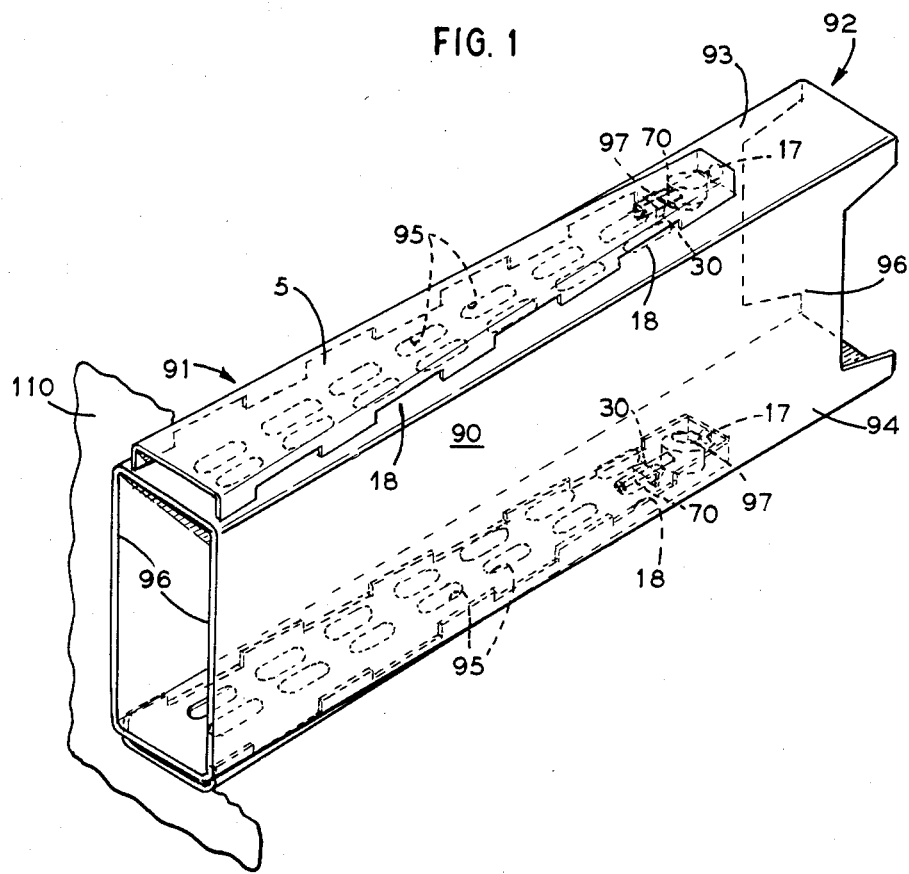
FIG. 1 is an isometric projection of the present invention.

Referring to the drawings generally and to FIGS. 1, 2, 3, 4, and 5 in particular, wherein like numerals designate the same element of the invention throughout the several drawings, the invention embodied therein comprises a mounting bracket assembly 5 for securing a housing module 90 containing electronics (not shown) to a control panel 110. The mounting bracket assembly is actually comprised of four subassemblies: a mounting bracket 10; a guide 30; a slide nut 50; and a threaded bolt 70.

The mounting bracket 10 is made of steel, but other materials such as aluminum or other metals that can be manufactured by a stamping or an extrusion process could also be used. In the former case, the stamped piece would have to undergo a further forming operation to create the desired shape of the mounting bracket 10. The mounting bracket 10 has a wide end, generally refered to as 11, and a narrow end, generally referred to as 12. A notch 19, located at the narrow end 12 of the mounting bracket 10, is present due to the manufacturing requirements when the mounting bracket 10 is formed from a stamping. Once the general shape of the mounting bracket 10 has been stamped out, the sides 13 and 14 have to be folded inwardly so that they are substantially perpendicular to the side 15. Then, side 16 is folded inwardly such that the narrow end edges 13b and 14b (of sides 13 and 14, respectively) will bear upon the underside surface 16b of side 16. The notch 19 prevents a "kinking" or localized deformation of the material at the point of intersection of the two "fold lines" described above. Of course, such a notch 19 would be unnecessary in a mounting bracket 10 made by an extrusion process, since in the latter process, the shape could be created as a continuous part of the extrusion process in one step.

Figure 4:
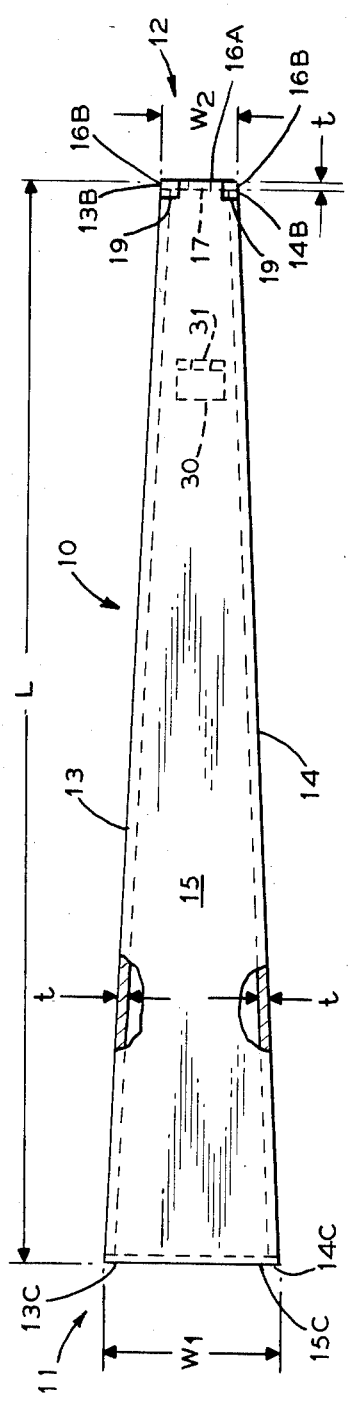
FIG. 4 is a plan view of the mounting bracket of the present invention.

Referring to FIG. 4, the preferred dimensions of the wide end 11 and narrow end 12 are $W1 = 2\frac{3}{8}''$ and $W2 = 1''$, respectively, are for standard panel mounted control instruments. Clearly these dimensions can be varied to suit the width and length of other housing modules, as long as the same general proportions are substantially maintained. Together with sides 13 and 14, which are identical to each other, the mounting bracket 10, as seen from the top (FIG. 4) is trapezoidal in shape, the surfaces of wide end 11 and narrow end 12 being substantially parallel to each other. As will be seen from FIGS. 1-5, mounting bracket 10 has four sides, 13, 14, 15, and 16, which partially enclose and define a trapezoidal wedge-shaped volume of height H1. Sides 13, 14 and 16 are substantially perpendicular to side 15, and all are of the same, uniform thickness t (within normal manufacturing tolerances). The preferred dimension for thickness t is 0.060'', but this can be varied to suit a particular application if necessary. Measured from the top surface 15a to the plane defined by bottom edges 13a, 14a, and 16a, the preferred height H1 of the mounting bracket 10 is $\frac{3}{8}''$, but this can be increased to suit the overall length of the mounting bracket 10, keeping in mind that excessively slender mounting brackets 10 are to be avoided.

Figure 5:
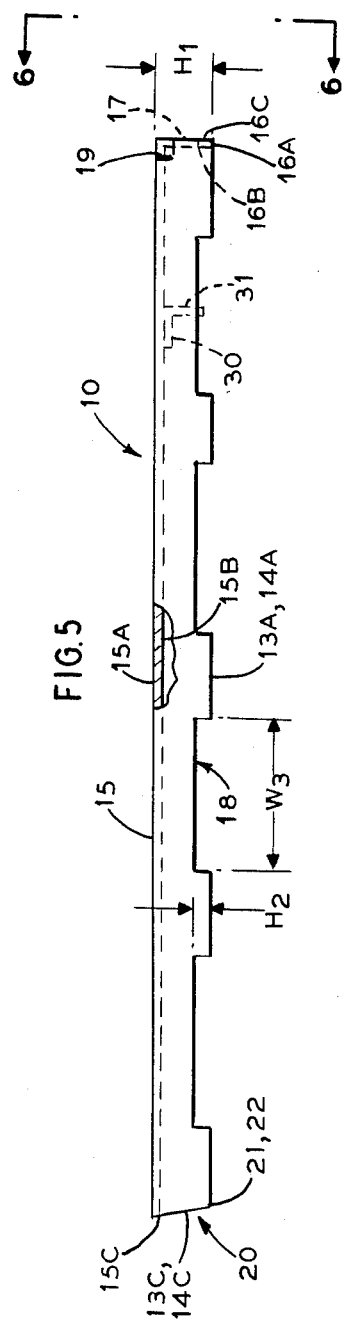
FIG. 5 is a side view of FIG. 4.

Referring to FIG. 5, sides 13 and 14 are seen to have a plurality of regularly spaced, rectangular side slots 18 of width W3 and height H2. These side slots 18 permit the ingress and egress of natural convection air currents from the housing modules 90, as will be described more fully hereinafter. Preferred dimensions of W3 and H2 are $1\frac{1}{8}''$ and 0.25'', respectively, although these dimensions are not critical. In a preferred embodiment, the first such side slot 18 would be placed in sides 13 and 14 at approximately 1'' from the wide end 11 of the mounting bracket 10, measured along the top side 15; additional side slots 18 would be spaced approximately $1\frac{3}{8}''$ apart and would continue the pattern along sides 13 and 14 until the narrow end 12 is approached. The extent and number of the side slots 18 in the mounting bracket 10 depends upon the overall length of the housing module 90 that is to be secured by the mounting bracket assembly 5 to the control panel 110, described more fully hereinafter.

Figure 6:
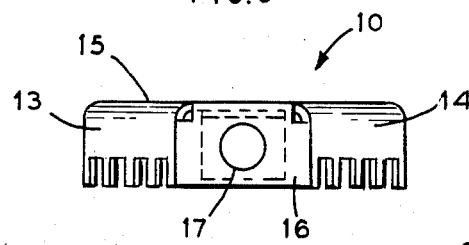
FIG. 6 is an end view taken along line 7—7 of FIG. 6.

Referring to FIG. 6, side 16 is seen to have a centrally disposed hole 17 therein, through which the threads 72 of threaded bolt 70 are intended to pass. The diameter of hole 17 is designed to be just large enough to permit the threads 72 of threaded bolt 70 to pass therethrough without engagement of the threads 72 by the sides of the hole 17. It will be noted, however, that the slotted head 71 of threaded bolt 70 is of sufficient diameter that it will not pass through hole 17, and yet does not exceed a diameter of H1 (so that there is no interference between the slotted head 71 and the housing module 90).

The guide 30 is shown in FIGS. 4, 5, and 6. One leg of L-shaped guide 30 is permanently attached to the underside surface 15b of side 15, by welding or other suitable means. The other leg of guide 30 is also seen to contain a centrally disposed hole 31 located therein. The diameter of hole 31 is again designed to be just large enough to permit the threads 72 of threaded bolt 70 to pass therethrough without engagement of the threads 72 of threaded bolt 70 by the sides of the hole 31. Guide 30 is positioned on the underside surface 15b of side 15 such that the longitudinal axis of the hole 31 lies on the same longitudinal axis as that of hole 17 located in side 16, and this common longitudinal axis is parallel to the top side 15 and equidistant from sides 13 and 14 at all points. Guide 30 is also positioned at a distance away from the side 16 such that the end 73 of threaded bolt 70, when fully inserted through hole 17, and thence through hole 31, will extend past the leg of guide 30 containing hole 31 when the mounting bracket assembly 5 is in place and ready to secure the housing module 90.

Figure 7:
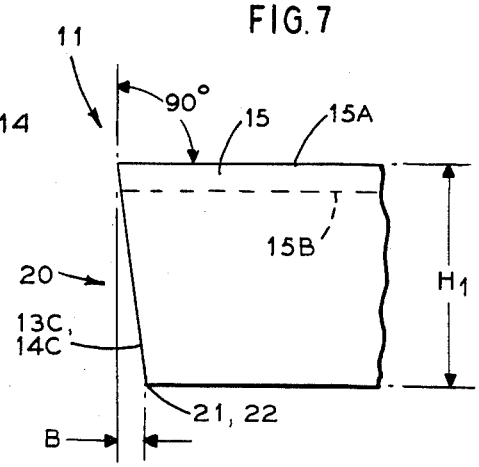
FIG. 7 is a close-up side view of the beveled end of FIG. 6.

Turning now to FIG. 7, it will be seen that the wide end 11 of the mounting bracket 10 is specifically designed to have a beveled end 20. That is, the plane surface defined by the edges 13c, 14c, and 15c is not perpendicular to the plane defined by surface 15a. Instead, the corners 21 and 22, defined by the intersection of edges 13a and 13c, and 14a and 14c, respectively, are located a distance b measured away from a line segment perpendicular to surface 15a (and towards the narrow end 12) located at edge 15c. The preferred dimensions for distance b is 0.018". As will be described more fully hereinafter, it is this beveled end 20 that allows the mounting bracket assembly 5 to "bow" towards the housing module 90 when threaded bolt 70 is tightened, thereby making the mounting bracket assembly 5 self-compressing against the housing module 90.

Figure 8:
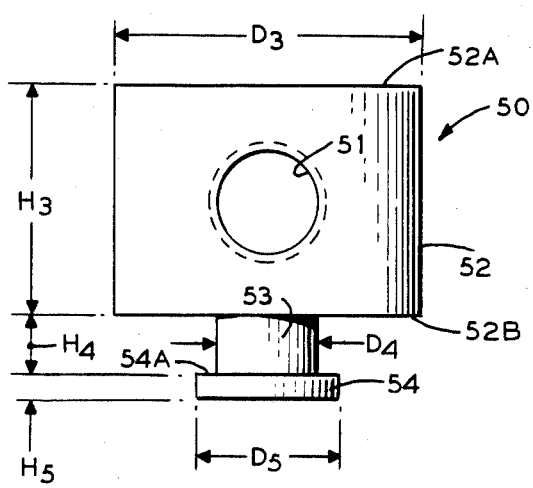
FIG. 8 is a side view of the slide nut of the present invention.
Figure 9:
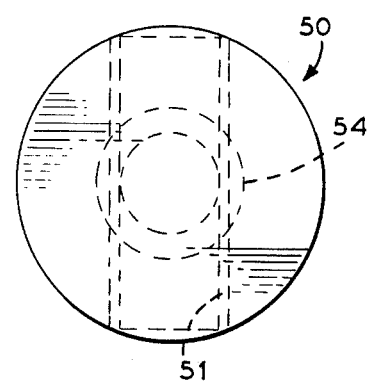
FIG. 9 is a plan view of FIG. 8.

The slide nut 50 is shown in FIGS. 8 and 9. Slide nut 50 is seen to have three cylindrical shaped sections, each of which shares the same common longitudinal axis of symmetry. These sections are: upper section 52, neck section 53, and lip section 54. Flat, parallel surfaces 52a, 52b, 54a, and 54b are all perpendicular to the above-mentioned common longitudinal axis of symmetry and further define upper section 52, neck section 53, and lip section 54. Slide nut 50, therefore, could easily be machined from a single piece of bar stock. The heights of upper section 52, neck section 53 and lip section 54 are shown as H3, H4, and H5, respectively; their respective diameters are shown as D3, D4, and D5. Preferred dimensions for D3, D4, and D5 are 0.75", 0.25", and 0.36" respectively. Preferred dimensions for H3, H4, and H5 are 0.56", 0.14" and 0.06" respectively.

Figure 10:
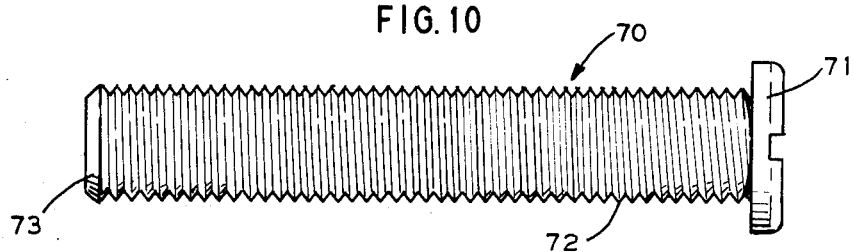
FIG. 10 is a view of the threaded bolt of the present invention.
Figure 11:
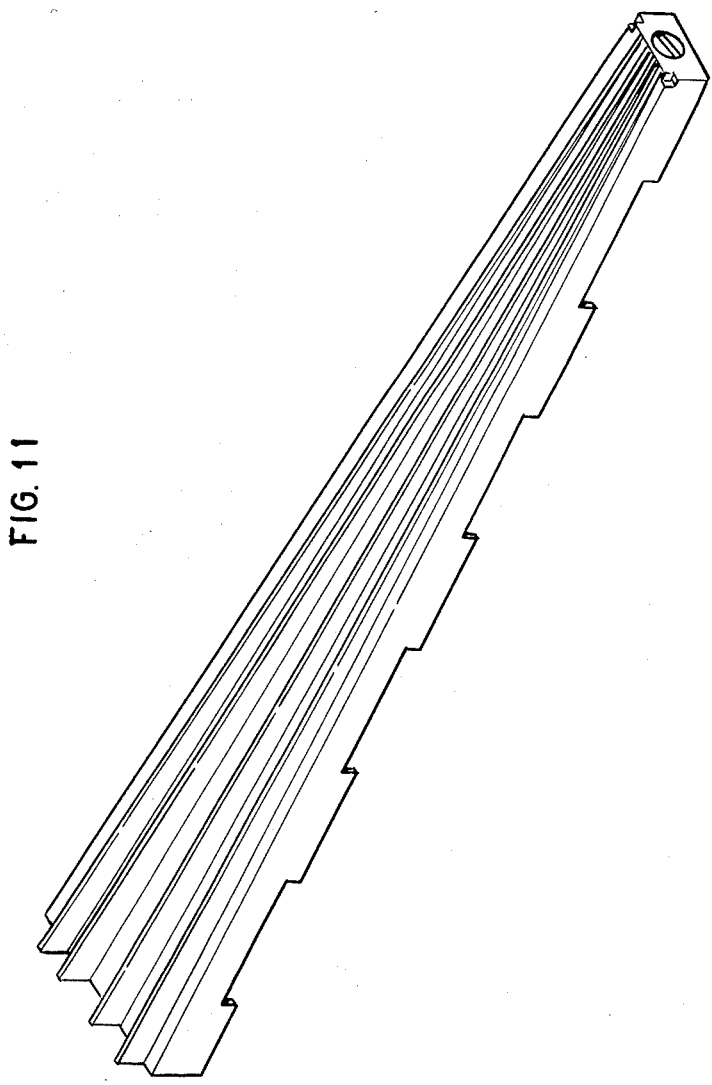
FIG. 11 is an alternative embodiment of the present invention.

The upper section 52 of slide nut 50 contains a threaded hole 51, completely passing therethrough, and having a diameter and thread configuration adapted to be removably engageable with the threads 72 of threaded bolt 70. Threaded bolt 70 is shown in FIG. 10. Threaded hole 51 has its longitudinal axis of symmetry perpendicular to and intersecting with the above-described common longitudinal axis of symmetry that defines sections 52, 53 and 54 and is located approximately midway between surfaces 52a and 52b. The precise location of threaded hole 51 is chosen such that when surface 52a of slide nut 50 is slidably engaged with the underside surface 15b of mounting bracket 10, the longitudinal axis of threaded hole 51 is coincident with the common longitudinal axis of hole 31 in guide 30 and hole 17 in mounting bracket 10. Similarly, the dimension H3 of slide nut 50 is also chosen such that, when surface 52a and underside surface 15b are slidably engaged as described above, surface 52b of slide nut 50 does not project past the plane defined by edges 13a, 14a, and 16a of mounting bracket 10.

The assembly of the mounting bracket assembly 5 will be discussed next. First, for convenience, mounting bracket 10 can be laid on a surface such that the underside surface 15b is face up. Slide nut 50 is then placed on the mounting bracket 10, inbetween guide 30 (already attached) and side 16, with the surface 52a of slide nut 50 in sliding contact with the underside surface 15b, and with the longitudinal axis of the threaded hole 51 lined up with those of hole 31 and hole 17. The end 73 of threaded bolt 70 is then inserted through hole 17, threadably engaged through threaded hole 51, and thence through hole 31.

The neck section 53 and lip section 54 of the slide nut 50 is the means by which the mounting bracket assembly 5 is removably attached to the housing module 90. FIGS. 1, 2, and 3 show various views of the mounting bracket assembly 5 mounted on the housing module 90; FIG. 3 shows the housing module 90 secured to the control panel 110 by the mounting bracket assembly 5.

Referring to FIGS. 1 and 2, housing module 90 has a front end, generally referred to as 91, and a rear end, generally referred to as 92. The top side 93 and bottom side 94 of the housing module 90 are seen to have a plurality of openings 95 located therethrough. These openings 95 allow natural convection air currents to pass through the housing 90 to dissipate the heat generated by the electronics contained therein. A hole 97 is present in both the top side 93 and bottom side 94 of the housing module 90, centered with respect to the sides 96 of the housing module 90 and near the rear end 92 of same. It is this hole 97 that is removably engageable with the neck section 53 and lip section 54 of slide nut 50, thereby attaching the mounting bracket assembly 5 to the housing module 90. The diameter of hole 97 is such tht the diameter D5 of lip section 54 will just pass through it, permitting the neck section 53 of the slide nut 50 to bear upon the edge of hole 97. Accordingly, the height H4 of neck section 53 is chosen such that it is just slightly larger than the thickness of the plate material used for the housing module 90. The difference between the diameter D5 of the lip section 54 and the diameter D4 of the neck section 53 (the diameter of D5 being greater than that of D4) is chosen such that the housing module 90 will not easily disengage from the slide nut 50. The diameter D4 of neck section 53 is also chosen such that it will not fail when loading due to tightening of the threaded bolt 70 is applied. Similarly, the height H5 of lip section 54 is chosen so that the weight of the housing module 90 and included electronics will not deform the lip section 54.

Referring to FIG. 3, the housing module 90 is designed to be removably secured to the control panel 110. Openings 111 are provided in the control panel 110 that will closely accept the housing module 90. The housing module 90 has, at the front end 91, an outwardly projecting lip 98, extending substantially along the entire perimeter defined by the sides 93, 94 and 96 of the housing module 90. To mount the housing module 90 to the control panel 110, the rear end 92 is first inserted into an opening 111 until the rear surface 98a of the lip 98 comes into contact with the front face 110a of the control panel 110, thereby preventing the housing module 90 from passing completely through the opening 111.

At this point, the mounting bracket assembly 5 is placed in contact with the housing module 90, such that the wide end 11 of the mounting bracket 10 is in contact with the rear face 110b of the control panel 110. At the same time, the lip section 54 and the neck section 53 of the slide nut 50 are engaged into the hole 97 of the housing module 90. It will be noted that the relative position of the leg of guide 30, containing hole 31, is located with respect to the side 16 of mounting bracket 10 in such a manner that variations in the exact placement of hole 97 can be easily accommodated through adjustments of the location of the slide nut 50. Once the mounting bracket assembly 5 has been attached to the housing module 90, the threaded bolt 70 is tightened, by means of the slotted head 71. As threaded bolt 70 is tightened, assuming that the underside surface of the slotted head 71 is bearing upon the surface 16c of the mounting bracket 10, the slide nut 50 will be initially urged towards the narrow end 12 of the mounting bracket 10. Side 16 will not bend towards surface 15c of the mounting bracket 10, since the underside surface 16b bears upon the narrow end edges 13b and 14b. However, since the neck section 53 of the slide nut 50 is bearing upon the edge of the hole 97, the slide nut 50 will not move rearward; instead, the mounting bracket 10 will be urged forward, thereby pressing the wide end 11 against the rear face 110b of the control panel 110, and pressing the lip 98 of the housing module 90 against the front face 110a of the control panel 110, thereby fixedly securing the mounting bracket assembly 5 and the housing module 90 to the control panel 110.

Now the operation of the beveled end 20 will be discussed. As the threaded bolt 70 is tightened, the first contact between the mounting bracket 10 and the rear face 110b of the control panel 110 occurs only at edge 15c of the mounting bracket 10. Further tightening of the threaded bolt 70 will attempt to "bow" the mounting bracket 10, but it is restrained from excessive motion since it lies next to the housing module 90 and is held in place from bowing outwardly by the combined actions of the slide nut 50 and the threaded bolt 70, which removably secure the guide 30 and the mounting bracket 10 to the housing module 90. Since the longitudinal axis of the threaded bolt 70 lies between the edge 15c of mounting bracket 10 and the housing module 90, and by virtue of the orientation of the beveled end 20, any bowing of the mounting bracket 10 will be towards the housing module 90 rather than away from it. The mounting bracket assembly 5 will thus be seen to be self-compressing against the housing module 90.

Since the points of contact on the mounting bracket 10 comprise a line (at the rear face 110b of the control panel 110) and a point lying substantially midway between the ends of the above line (the hole 17 at the narrow end of the mounting bracket 10) the mounting bracket assembly 5 is essentially self-aligning, both with respect to the housing module 90 and to the control panel 110, since the load is centrally and evenly distributed.

While a specific embodiment of the present invention has been shown and described in detail to illustrate the application of the principles of the invention, it will be understood that it is not intended that the present invention be limited thereto and that the invention may be embodied otherwise without departing from such principles.

What is claimed as new and desired to be secured by Letters Patent of the United States is:

1. A mounting bracket assembly, locatable along a side of a housing module having openings to permit heat dissipation therethrough that is mountable into an opening in a control panel having a front and a rear face, comprising:

a mounting bracket, having
 (a) a first trapezoidal-shaped side having a narrow edge, a wide edge and two equal edges:
 (b) second and third substantially rectangular-shaped sides, each attached at one edge thereof to one of the two equal edges of the first side and being substantially perpendicular to the first side, each having a plurality of regularly spaced, rectangular side slots located on the edge opposite the edge attached to the first side, and each having a beveled edge located near the wide edge of the first side: and
 (c) a fourth rectangular-shaped side, attached at one edge to the narrow edge of the first side and substantially perpendicular thereto, having a first centrally disposed hole therethrough, and which bears upon an edge of each of the second and third sides opposite the beveled edge thereof for support:
such that the mounting bracket has a beveled front portion for engaging the rear face of the control panel and causing the mounting bracket to bow towards the side of the housing module when the beveled front portion is pressed against the rear face of the control panel; and
means for mounting said mounting bracket to said housing module so that an outwardly projecting lip of the housing module is pressed against the front face of the control panel when the beveled front portion is pressed against the rear face of the control panel.

2. A mounting bracket assembly, locatable along a side for housing module having openings to permit heat dissipation therethrough that is mountable into an opening in a control panel having a front and a rear face, for providing an increased heat transfer area to the mounting bracket assembly and housing module, comprising:

a wedge shaped mounting bracket assembly having a series of radially extending fins extending along a top surface thereof, away from the housing module, side portions having a series of slots extending along the length thereof, the side portions extending perpendicularly to the top surface of the mounting bracket, and a beveled front portion for engaging the rear face of the control panel and causing the mounting bracket to bow towards the side of the housing module when the beveled front portion is pressed against the rear face of the control panel; and
means for mounting said mounting bracket to said housing module so that an outwardly projecting lip of the housing module is pressed against the front face of the control panel when the beveled front portion is pressed against the rear face of the control panel.

3. A mounting bracket assembly, locatable along a side of housing module having openings to permit heat dissipation therethrough that is mountable into an opening in a control panel having a front and a rear face, comprising:

a mounting bracket, having a beveled front portion for engaging the rear face of the control panel and causing the mounting bracket to bow towards the side of the housing module when the beveled front portion is pressed against the rear face of the control panel; and means for mounting said mounting bracket to said module so that an outwardly projecting lip of the housing module is pressed against the front face of the control panel when the beveled front portion is pressed against the rear face of the control panel, said means including:

(a) a slide nut having
  (i) a threaded hole completely passing through an upper section of a first diameter;
  (ii) a neck section of a second diameter, smaller than the first diameter of the upper section of the slide nut, attached to one end of the upper section; and
  (iii) a lip section of a third diameter, larger than the second diameter of the neck section of the slide nut, for removably engaging a third hole in the housing module having a fourth diameter larger than the third diameter to mount the mounting bracket to the housing module;

(b) an L-shaped guide, secured at a first leg to the underside surface of the mounting bracket and having, in a second leg, a second centrally disposed hole therethrough, having an axis of symmetry coincident with that of the first centrally disposed hole located in the fourth rectangular-shaped side of the mounting bracket; and (c) a threaded bolt for passing through the first centrally disposed hole, removably engaging the threaded hole in the slide nut, and passing through the second centrally disposed hole located in the L-shaped guide.

* * * * *